United States Patent [19]

Dimon

[11] 4,320,531
[45] Mar. 16, 1982

[54] TIME SHARED FREQUENCY CONVERSION SYSTEM

[76] Inventor: Donald F. Dimon, P.O. Box 15607, Fort Lauderdale, Fla. 33318

[21] Appl. No.: 21,941

[22] Filed: Apr. 2, 1979

[51] Int. Cl.³ .............................................. H04B 1/26
[52] U.S. Cl. ..................................... 455/203; 328/15; 329/154; 363/177; 455/118
[58] Field of Search ................................ 325/430–435, 325/438, 439, 368, 370, 315–317, 9–11, 153, 458, 461, 465, 156, 419, 50, 49, 137, 329, 330, 344, 349, 351; 328/15–18, 103, 152; 329/150, 153, 154, 50, 110; 363/157, 177, 178; 370/50, 77, 112, 114; 455/20, 109, 118, 131, 142–144, 190, 203, 275, 313

[56] References Cited

U.S. PATENT DOCUMENTS

| | | | |
|---|---|---|---|
| 2,637,808 | 5/1953 | Herrick | 325/317 |
| 2,715,179 | 8/1955 | Cornet | 325/317 |
| 3,370,128 | 2/1968 | Morita et al. | 370/50 |
| 3,414,821 | 12/1968 | Bickers et al. | 325/433 |
| 3,614,627 | 10/1971 | Runyan et al. | 325/432 |
| 3,665,507 | 5/1972 | Peil | 325/315 |

*Primary Examiner*—Marc E. Bookbinder
*Attorney, Agent, or Firm*—Charles H. Lindrooth; Albert L. Free

[57] ABSTRACT

A frequency conversion system, including a time shared frequency converter and a time shared band limited amplification system, whereby a plurality of information bearing signals are commonly obtained, determined, filtered and amplified over a single path. The process admits signals whose carriers are separated by frequency or phase, and whose amplitudes are different.

Synchronous and asynchronous receivers which ordinarily require dual mixers, filters and amplifiers are simplified by this invention. Phase locked loop demodulators, including AM, DSSC and Costas loop demodulators, which ordinarily require a pair of phase detectors, filters and amplifiers to generate the in-phase and quadrature-phase channels are simplified by this invention. The use of a common path for the in-phase and quadrature-phase channels also permits the close matching of gain and frequency response in each channel.

Where a plurality of signals having diverse amplitudes are to be commonly processed herein, this invention permits selective automatic gain control by regulating the relative time each such signal is applied to the common path.

5 Claims, 7 Drawing Figures

TIME SHARED FREQUENCY CONVERSION SYSTEM

RELATED U.S. PATENT DATA

John P. Costas, Aug. 20, 1963, U.S. Pat. No. 3,101,448.

BACKGROUND OF THE INVENTION

This invention relates to frequency conversion sytems and more particularly to a novel and useful time shared frequency conversion system wherein two or more information bearing signals are processed over a common frequency conversion signal path. In modulation and demodulation systems requiring an in-phase and a quadrature-phase channel, this invention provides an economy of components and automatic balancing of gain, frequency response and other electrical properties, by reason that only one set of components are required for the common time shared signal path. In superhetrodyne and direct conversion radio receiving systems, the first mixer must be of good quality in order to provide high quality performance. To receive a number of channels simultaneously, ordinarily requires a separate mixer, and band limited amplification system, such as an intermediate frequency (I.F.) amplifier, for each such channel. This invention provides that only one mixer and band limited amplification system may be employed, with the economy of reduced components, and reduced size. The savings may be utilized to incorporate a much higher quality mixer to the greatly improved performance of all channels.

A number of phase locked loop processes employ two channels, with a 90° phase difference between channels. When the loop is in lock, one channel ordinarily carries phase error data, while the other, in-quadrature channel, carries amplitude data. In this invention only one channel is required for both. The Costas loop and asynchronous processes which include dual channels all find useful application of this invention. Asynchronous processes permit modulation and demodulation without locking. A beat note carrier will be found in each of two quadrature channels. The beat note will cancel by trigonometric relations, provided that each channel have identical gain. This invention provides the required identical gain and other desirable properties.

THEORY USED IN THE INVENTION

This invention utilizes sampling techniques, wherein it is well known in the electrical arts that an entire message may be faithfully reproduced by sampling at regular intervals rather than continuous means. The sampling theorem teaches that a band limited function of time containing no frequencies higher than W may be completely determined by giving the value of the function at a series of points spaced no greater than $\frac{1}{2}$ W apart. (Where time is in seconds and W is in cycles per second.) In this invention, this theorem is used to properly design embodiments hereof. A sampling rate is utilized that is at least twice the frequency of any included sampled data. When applied to a modulated carrier, the sampling theorem applies only to the data or modulating frequency and not the carrier frequency. We are free to crop or otherwise sample the modulated carrier at a rate above 2 times the data frequency and generally may ignore the carrier frequency. The sampling process is carried out at high signal levels preferably. For example the oscillator injection signal is sampled and selected from a plural number of sources and processed over the same mixer, without affecting any connection to a low level input port of the mixer, so that commutation noise will not mask an input signal. The frequency response of the common channel is kept such that bandwidth of 2 times the sampled data rate is maintained at all times. The sampled data is then applied to appropriate filters, which collect and smooth the data into a continuous smooth signal, and provide final selectivity. The sampling process is synchronous, in that a separate oscillator, preferably square wave, is used to selectively operate analog switches to apply two or more oscillator signals for example to a mixer, and also employed to apply the properly timed and selected time shared signals to their appropriate filters for final filtering and isolation. In some embodiments, mixers operate as analog switches and are used in such a capacity.

The terms mixer, multiplier, modulator, phase detector are used interchangeably herein, and are used to denote a signal multiplication apparatus in each instance, where the amplitude information in a data path is not lost. Multiplier is used alone where amplitude information must be preserved in both applied mixing paths. In frequency conversion, the amplitude information in the oscillator path is not usually preserved, and the oscillator injection is usually set to completely turn the mixing device on and off, with the output responding at the output to the input amplitude data.

In this invention, a common mixer is used in a plural number of locations in a complex signal handling system. The time in which said mixer is applied to each location, will determine the relative amplitude or gain in each such location. In two channel systems, where interaction between the two channels occurs for cancellation of undesirable signals, it is preferable to time share the mixer equally between the two channels created so that signal gain will be alike in each case. Equal time of application will be found preferable in most applications of the invention, even with a large number of channels, since the switching system will be more economical to erect from a single timing source. However, where automatic gain control is desired in one or more channels, the timing cycle is controlled to apply a switching interval to a particular channel to be gain controlled in proportion to the desired gain for that channel. Such means of controlling the application time of a switch are well known in the art, and highly developed with commonly available digital means of timing control, as well as older methods of analog control.

The frequency response of the mixer and bandlimited amplifier following the mixer is chosen to not limit system performance. Actual bandwidth determination is made at the final filters $F_1, F_2, -F_n$ in each case as shown in the descriptions. This is done to prevent cross talk between channels by data storage in the mixer amplifier combination such that energy from one channel will be slightly delayed and thus appear in the next interval designated for a separate channel. The purpose of the band limiting amplifier just after the mixer is to provide some signal gain to mask switching transients, and to provide, if necessary by choice of the designer, some reduction in noise and undesirable higher frequency energies which might serve to overload or to interfere with subsequent stages in the overall system. In most applications, no amplifier will be necessary, or a simple matching stage may be employed to provide a low impedance source to the multiplexing and switching networks to follow. In general, the mixer and amplifier are not determining upon the bandwidth of the system and are chosen for practical design reasons directly related to the performance specifications of individual components available and chosen for implementation.

In this invention, where a number of mixers, or a combination of mixers and multipliers are required, a single device may be employed with adequate multiplex switching. The single device, must of course meet all requirements for each application point in the multiple mixing, multiplying functions. For example, in FIG. 3, a Costas phase locked loop is shown with a separate phase detector or mixer 361. This mixer could also be eliminated and simply multiplexed in with the two channels shown multiplexed. Likewise in FIG. 4 a second multiplier, mixer 409 is shown, to teach the invention. This device 409, may also be removed with the function of 409 multiplexed in with the two channels shown. The choice of extreme reduction of components is left to the designer, who must weigh the features and advantages of using a common more elaborate mixing device to meet all requirements or separate devices, where specifications for mixing are greatly different and single implementation would be too costly or otherwise undesirable. The examples are not limiting on the broad invention but exemplary only.

SUMMARY OF THE INVENTION

In accordance with the present invention, a plural number of oscillator signals separated by frequency or phase or both is applied to a frequency conversion system. The plural number of oscillator signals are coded and commutated by a separate reference signal source which is also used to synchronously commutate the time shared common frequency conversion system into appropriate separate filters which reproduce the desired data signals time shared and processed over the common path. The use of the common path simplifies gain and frequency response matching in dual channel systems, such as used in single sideband generation by phasing means, phase locked loops using quadrature methods, synchronous and asynchronous modulation and demodulation processes all employing a plural number of channels simultaneously. The invention may be used in all applications where more than one channel of frequency conversion is required at one time or in one system. The invention may be further understood from some of its objects and advantages, which are noted here and not limiting on the invention.

One object of the invention is to provide a common mixer and I.F. amplifier in a multiple frequency receiving or transmitting system.

One other object of the invention is to provide an economy of components in a multiple signal frequency conversion system.

Another object of the invention is to provide gain and frequency response matching in dual channel frequency conversion systems.

Another object of the invention is to regulate the gain of a time shared frequency conversion system, and to separately regulate the gain of each time shared signal produced.

Another object of the invention is provide in-phase and quadrature phase data processing channels in a phase locked loop demodulator with a single mixer or phase detector.

A still further object of the invention is to provide an economy of mixers and other components in a single sideband modulation or demodulation system.

It is also an object of the invention to provide quadrature channels in a modulation or demodulation system without the need of additional signal handling components such as mixers and amplifiers.

Other objects and advantages of the invention may be seen from descriptions of preferred embodiments and from the appended drawings.

DESCRIPTION OF A PREFERRED EMBODIMENT

Figure 1:
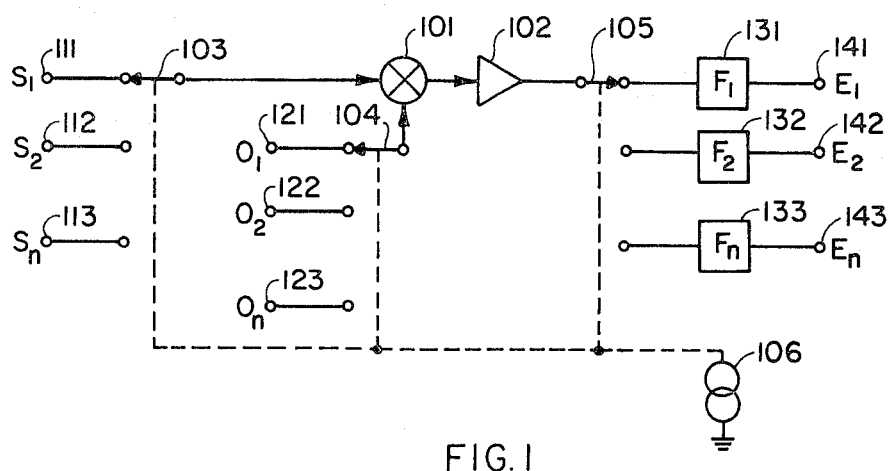
FIG. 1 illustrates a generalized block diagram of the invention.

Reference is made to FIG. 1, wherein a block diagram is shown of a preferred embodiment of the invention. In FIG. 1, a mixer 101, and amplifier 102, is connected to a multiple pole, multiple position switch 103, 104 and 105, which is driven from a signal source 106. 103, 104 and 105 refer to separate sections of the switch each of which make contact at corresponding positions 1, 2 to n at the same time for each section. The rate of switching is rapid. Methods and details of erecting such switches are well known in the art and include the use of analog multiplexers and/or digital means all with the intent and purpose of having each switch section timed or ganged together so that $S_1$ 111 is applied to the mixer at the same time that $O_1$ 121 is applied to the mixer 101, and both at the same time that $F_1$ 131 is connected to the amplifier 102. Likewise each switch position is commutated at the same time for corresponding numbers of input signals, oscillators and output filters. According to this invention, S1 111 and $O_1$ 121 will be mixed at 101, amplified at 102 and filtered at $F_1$ 131, producing a continuous function at $E_1$ due to the holding, integrating and smoothing action of $F_1$. In the next instant of switch commutation, $S_2$ 112, and $O_2$ 122 will be mixed at 101, amplified at 102, and filtered at $F_2$ 132, producing a separate continuous function at $E_2$ due to the holding, integrating and smoothing action of $F_2$. Similarly for each instant of switch commutation at a new set of positions or electrical connections made by the synchronous switch assembly 103, 104, 105, 106. According to the invention, the bandwidth of amplifier 102 is large compared to final filter bandwidths 131, 132, etc., and the common mixer 101 and amplifier 102 serve all n channels of mixing and amplification by time sharing their common use. Switching transients will be largely removed by the individual filters used to smooth and hold the output signals $E_1$, $E_2$, etc., to $E_n$.

DESCRIPTION OF ANOTHER EMBODIMENT OF THE INVENTION

Figure 2:
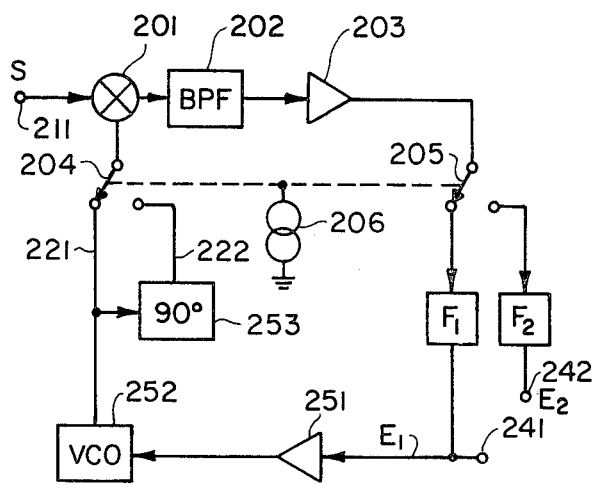
FIG. 2 illustrates a phase locked loop according to the invention.

In FIG. 2, the invention is shown in a preferred phase locked loop embodiment. In FIG. 2, an amplitude modulated signal S is applied at 211 to a mixer 201 driven from a time shared oscillator source $O_1$ and $O_2$ which are separated by 90° in phase by phase shift network 253, and generated by VCO 252. A switch 204 time shares the two oscillator signals and applies them to mixer 201. The alternately in-phase and quadrature phase signals are amplified and filtered at 203 and 202 and applied to a synchronous switch section 205, synchronized to 204 and driven from a common source 206. At the same instant that mixing takes place with $O_1$ 221, output switch 205 is connected to $F_1$ 241, which is the loop filter for the phase locked loop, completed by amplifier 251 and VCO 252. $F_1$ smooths and removes switching transients, causing the loop to lock on the applied carrier at S 211. At the next interval of switch commutation, $O_2$ is applied, filtered at 202, amplified at 203 and switched at 205 to $F_2$ 242, which is a separate filter used to store, integrate and smooth amplitude modulation data, since the signal path in common 201, 202, and 203 is now supplying signals 90° out of phase with the locked loop and its VCO 252. It is thus seen that this invention achieves a quadrature channel from a single mixer (phase detector) 201, and single amplifier and filter 202 and 203, which are time shared and used in common to the in-phase and quadrature phase channels.

Figure 3:
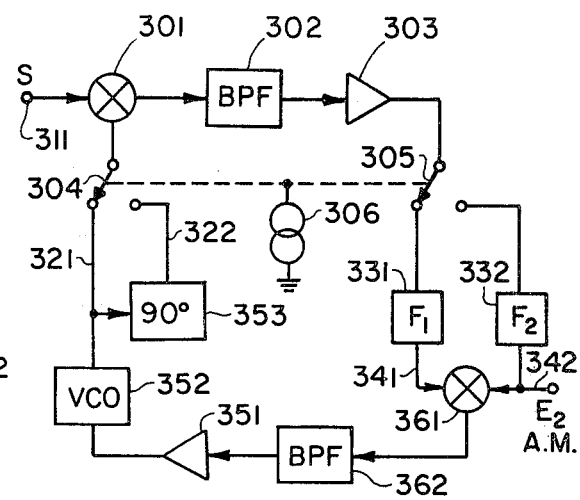
FIG. 3 illustrates a Costas phase locked loop according to the invention.

In FIG. 3, another embodiment is shown, which is similar to that shown in FIG. 2, but useful in obtaining DSSC (double sideband suppressed carrier) amplitude data from a phase locked signal. In FIG. 3, phase detector 361 is added to compare phases between quadrature channels produced at $F_1$ 331 and $F_2$ 332. The phase error is applied to loop filter 362, amplifier 351, and used to drive the VCO 352. It will be seen that the embodiment in FIG. 3 is corresponds to a Costas loop. Being analogous thereto, but not requiring the quadrature channel components of an additional mixer (phase detector), filter and amplifier. Also, it is seen that the gain of the in-phase and quadrature phase channels will be the same due to common signal path components which determine the gain of either channel, providing that switching time is equal in each channel. FIG. 2 and FIG. 3 have identical arrangements of components except for the items 361 and 362 and are numbered accordingly, to show the similarity, except that FIG. 3 numbers are increased by 100 in each instance. (Ref. Costas U.S. Pat. No. 3,101,448)

DESCRIPTION OF A FREQUENCY DISCRIMINATOR EMBODIMENT

Figure 4:
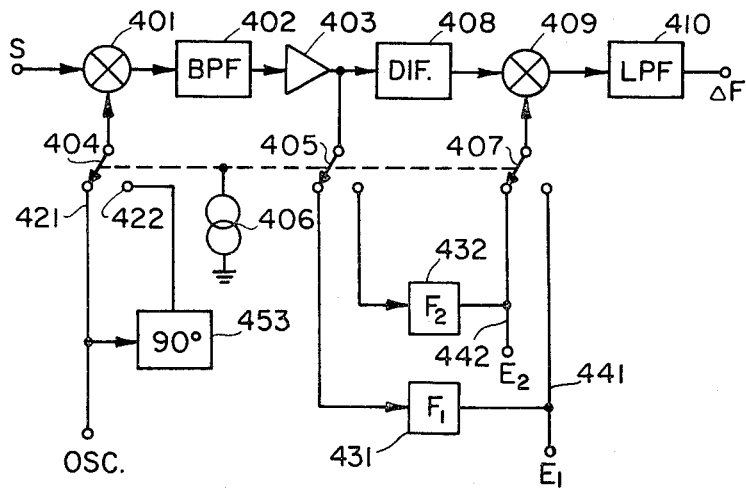
FIG. 4 illustrates a frequency discriminator according to the invention.

In FIG. 4, a frequency discriminator according to the invention is shown. FIG. 4 may be read and applied to the apparatus shown in FIG. 2, where the common channel 201, 202 and 203 correspond to elements 401, 402 and 403; and, switch 205 corresponds to switch 405. In FIG. 4, according to the invention, another section of the switching system is added at 407 to alternately collect the outputs at $F_1$ and $F_2$, but at opposing time intervals. That is switch section 407 is out of phase with the other sections for $F_1$ and $F_2$. The switched output from 407 is applied to a multiplier 409 along with the output of a differentiation circuit 408 driven from the amplifier 403. At the interval $O_1$ is applied to the mixer 401, the in-phase signal is differentiated at 408 and multiplied by the quadrature phase signal from $F_2$. At the next interval (only two intervals are used in the switching system), $O_2$ is applied to the mixer 401 and the quadrature channel is differentiated at 408 and multiplied with the in-phase signal at 409. Denoting the in-phase signal as cos wt, the quadrature phase signal as sin wt, we have at 409 alternately, $w \cos^2 wt$ and $w \sin^2 wt$. This signal is filtered at 410 which removes the beat note component by summation of the serial data train to produce at 411 a signal proportional to w, the frequency of the beat note in the two channels, which is the difference in VCO frequency and incoming signal frequency.

It was found, that depending upon the type of multiplier 409 and the phase polarity of the phase shift network 253, a 180° phase inversion (polarity reversal) was required in $F_1$ or $F_2$, all of which can be understood from the art, since differentiation of the cosine signal will produce a signal out of phase with the sine signal by 180°. It is seen that this embodiment of a discriminator has very desirable properties over the prior art, since the two signals, $w \cos^2 wt$ and $w \sin^2 wt$ are very much alike in amplitude due to the common use of mixer and amplifier channels which set the amplitude of the two quadratures, provided that switching time is equal for each channel. Equal amplitudes provides excellent cancellation of the beat note signal, and a smooth replica of the frequency difference w. This signal w may then be used to enhance locking by summing into the loop so as to force the VCO to the correct frequency when out of lock. This signal will produce damping as well if used to enhance locking, all in accordance with the invention. The signal w may be used to reproduce frequency modulation data asynchronously, by simply not locking the loop, and using a fixed oscillator at 253 and eliminating amplifier 251. In all discriminator applications, $F_1$ and $F_2$ preferably have identical frequency responses; and, where a specific loop bandwidth may be required, the amplifier gain 251 may be adjusted, or additional filtering employed in the path of amplifier 251.

The relative gain of a channel is controlled by the switching, multiplexing apparatus in each embodiment hereof. For equal gain in a two phase or two channel system, the timing cycle is simply made one half of the total for each of the two channels. This is easily seen, since the filters will sum the total energy received over numerous cycles, and the total will depend linearly upon the areas of time versus amplitude applied to each channel. The area will be the integral of applied energy with respect to time applied.

DESCRIPTION OF AN ASYNCHRONOUS AMPLITUDE DEMODULATOR

Figure 5:
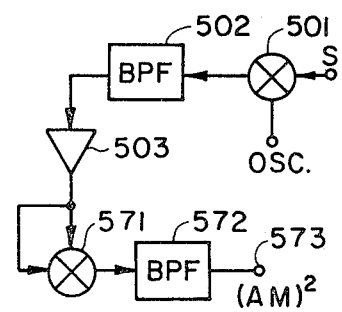
FIG. 5 illustrates an asynchronous squaring amplitude demodulator in accordance with the invention.

In FIG. 5, an asynchronous amplitude demodulator is shown in accordance with the invention. FIG. 5 is read on FIG. 2, and elements 501, 502, 503 correspond to elements 201, 202 and 203. In FIG. 5, a squaring device 571, which may be an analog or multiplier with both inputs parallelled, will alternately square the in-phase signal and the quadrature phase signal. This produces at one interval, $x^2 \cos^2 wt$ and at the next interval of switching, $x^2 \sin^2 wt$. These two signals are then filtered and smoothed at 572 to produce at 573 the signal $x^2$ which is the square of the amplitude data, without the beat note component. Since both channels have equal gain due to common components, the beat note will be greatly suppressed. No additional switch sections are required for collecting the amplitude data according to this invention. Signal $x^2$ at 573, may be compared to a reference voltage and amplified to control a prior automatic gain controlled stage, or an analog divider ahead of the mixing process at S 211, all according to the art for amplitude demodulation by feedback means, and for AGC systems. It is seen that, since data is processed in serial form, instead of parallel paths, addition may be accomplished by filtering, which adds alternate events in time and smooths the switching transients between such intervals. This process, further improves the economy of components, all according to the invention, by eliminating the need for a summing network or other device as ordinarily required in prior art systems for multiple path frequency conversion. Timing as in all two channel embodiments hereof is preferably made equal for each channel to enhance the trigonometric cancellation of the beat note. The beat note cancels by reason of the trigonometric identity, $\sin^2 + \cos^2 = 1$, as in the case of the discriminator (FIG. 4), and due to the filter summation and smoothing.

A SINGLE SIDEBAND EMBODIMENT OF THE INVENTION

Figure 6:
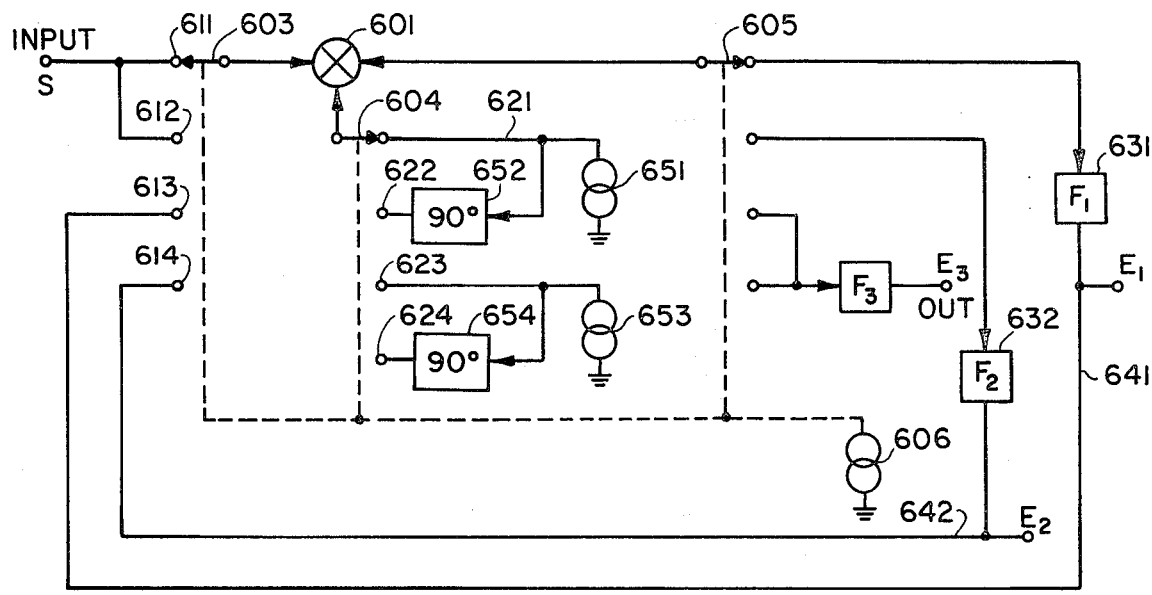
FIG. 6 illustrates a single sideband system in accordance with the invention.

In FIG. 6, the invention is shown connected for use as a single sideband system. The invention employs a single multiplier 601 which is time shared to produce all required signals for single sideband frequency conversion. The embodiment may be used for generation or demodulation and for either an upper or a lower sideband with simple exchanges of connections. An input signal S 611, is applied to positions 1 and 2 of section one of a three pole four position switch, which is driven by oscillator 606 at a high rate of speed to commutate all signals. Two oscillators are employed, 651 and 653 and two phase shift networks of 90° each, 652 and 654 to provide four separate, commutated oscillator injection signals, commutated by switch section 604, and applied to the multiplier 601. 601 may be a mixer or multiplier depending upon frequencies used in the apparatus, and quality of performance desired. The output of the multiplier 601 is switched at 605 to one of three filters, $F_1$ 631, $F_2$ 632, and $F_3$ 633. In position 1, the input of $F_1$ is collected and smoothed. In position 2, the input of $F_2$ is collected and smoothed. In positions 3 and 4, the input of $F_3$ is collected and smoothed; and, $F_3$ serves as an output of the system at 643. $F_1$ and $F_2$ are matched sideband filters, which will pass only one half of the desired total single sideband bandwidth. For example, where a total bandwidth of 300 to 3300 cycles per second is employed, $F_1$ and $F_2$ may be low pass filters of only 1500 cycles per second bandwidth. During positions 1 and 2, the first conversion takes place in quadrature, and $F_1$ and $F_2$ collect data. During positions 3 and 4, the outputs of $F_1$ and $F_2$, being connected to 603, are used to effectuate a second conversion with a different oscillator, also in quadrature and summed at $F_3$. Where oscillator 651 is of a higher frequency than oscillator 653, downwards conversion is effected, such as is required in a single sideband receiver. When oscillator 651 is of a lower frequency than oscillator 653, upwards conversion is effected, such as is required for a single sideband generator, for a transmitter, for example. Upper or lower sideband is selected by reversing either $E_1$ and $E_2$ at 603, or 621 and 622 at 604, or 623 and 624 at 604, or by reversing a phase shift network to achieve −90° phase shift, together with appropriate choice of oscillator frequencies. It is seen that the invention achieves a marked economy of components for single sideband operation. Prior art phasing methods of single sideband generation and demodulation require 4 mixers, multipliers or combination of mixers and multipliers to achieve the performance of the described embodiment. Also, the common use of only one mixer provides excellent gain matching and hence good rejection of the unwanted sideband. Where gain is required in the system, an amplifier is located just after the mixer 601 and just preceding switch 605. The amplifier gain will be included or excluded in positions 1,2 or 3,4 by connecting only to such positions as in which gain is desired in accordance with the signal levels included in the use of a particular design. The intervals of each positions are preferably timed to be equal for each of the four positions; however, only each pair of intervals 1,2 and 3,4 must be equal for good rejection of unwanted sidebands. That is, the time for 1 and 2 should be alike; and, the time for 3 and 4 should be alike. The filters $F_1$ and $F_2$ provide signal data storage, which alleviates the need that all four time intervals be alike, but only each pair as enumerated. A technical discussion of the generation of single sideband by phasing methods (as employed herein, but according to this invention) may be seen in Proceedings Of The IRE for 1956 V. 44 pt 12 pages 1703 to 1705 inclusive, by Donald K. Weaver, Jr. This method does not require a wide band phase shift network, and is preferable to providing quadrature channels of both oscillator and signal paths, as well known in the art.

In FIG. 6, a single sideband transmitter embodiment included an audio oscillator 651 with sin, 621 and cos, 622 phase separated outputs, an R.F. oscillator 653 with sin, 623 and cos, 624 phase separated outputs, a pair of filters $F_1$ and $F_2$ of low pass variety and cut off frequencies of 1,500 cycles per second each, and an I.F. filter $F_3$ of 3,000 cycles per second bandwidth, centered at the desired output frequency of the single sideband generator of FIG. 6. An audio signal was entered at S and during interval 1, where 611 is connected to the mixer, a cosine signal develops at 631 and is stored in $F_1$. This signal is the cosine of the incoming audio and 1800 cps oscillator frequency difference. During the next interval, the sine of the same frequency difference is developed by the mixer and connected to the $F_2$ filter. The filter outputs $F_1$ and $F_2$ are denoted as $E_1$ and $E_2$ respectfully. During the third interval of timing, $E_1$ is mixed with the sine of the R.F. oscillator signal (623) and stored and collected at $F_3$; and, during the fourth and final interval (for each cycle of the commutation system 606), $E_2$ is mixed with the cosine of the R.F. oscillator signal (624) and stored and collected also at $F_3$. This produces upper sideband single sideband modulation. The R.F. oscillator frequency is set at 1800 cycles per second above the virtual carrier desired. Lower sideband conversion takes place by simply reversing 623 and 624 and by setting the R.F. oscillator for 1800 cycles per second below the desired virtual carrier frequency desired. The I.F. filter, $F_3$ is chosen to center in the desired single sideband bandwidth, and was chosen as equal to the R.F. oscillator frequency for its center frequency. The signal produced at $E_3$ was then used to modulate a carrier. Other bandwidths are obtained by changing filter bandwidths and selecting proper carrier and audio oscillator frequencies.

In FIG. 6, a single sideband receiver embodiment included all the same components as the transmitter embodiment just above described, except that 651 and 653 were reversed, so that during intervals 1 and 2, the incoming R.F. signal was mixed with the sine and cosine respectfully of the R.F. oscillator signals, and the outputs of $F_1$ and $F_2$ were, during the intervals 3 and 4 mixed with the sine and cosine respectfully of the audio frequency generator, thereby producing the upper sideband demodulation at $F_3$ output, $E_3$. $F_3$ in this receiver embodiment having an audio bandwidth of 300 to 3,300 cycles per second. Lower sideband demodulation is accomplished by reversing sine and cosine connections at 621 and 622, and the R.F. generator is set for 1800 cycles per second below the virtual R.F. carrier frequency. The upper sideband operation requires that the oscillator signal be 1800 cycles above the virtual carrier.

By simple switching (manual front panel switch) a complete upper, lower sideband, transmitter and receiver may be constructed according to the invention with only a single mixer, and without the requirement for wideband phase shift networks. The front panel switch simply reverses sine and cosine connections with respect to intervals, changes R.F. oscillator frequency for selection of upper and lower sideband. A separate front panel switch changes the order of application of audio and R.F. oscillator signals respectfully and connects input signal S and output signals to appropriate portions of the rest of the completed transceiver. The commutation switching system driven at 606 was found to perform well with about ½ millisecond time for each interval, and was repeated in a continuous fashion by a digital system. The rate was adjusted slightly to prevent harmonics from being within the pass band of the R.F. signals included. Unwanted sideband rejection was accomplished by the steepness of the filters $F_1$ and $F_2$ and not by balancing, and the inherent balancing prevented distortion products from appearing.

DESCRIPTION OF A FOUR QUADRANT DEMODULATION SYSTEM

Figure 7:
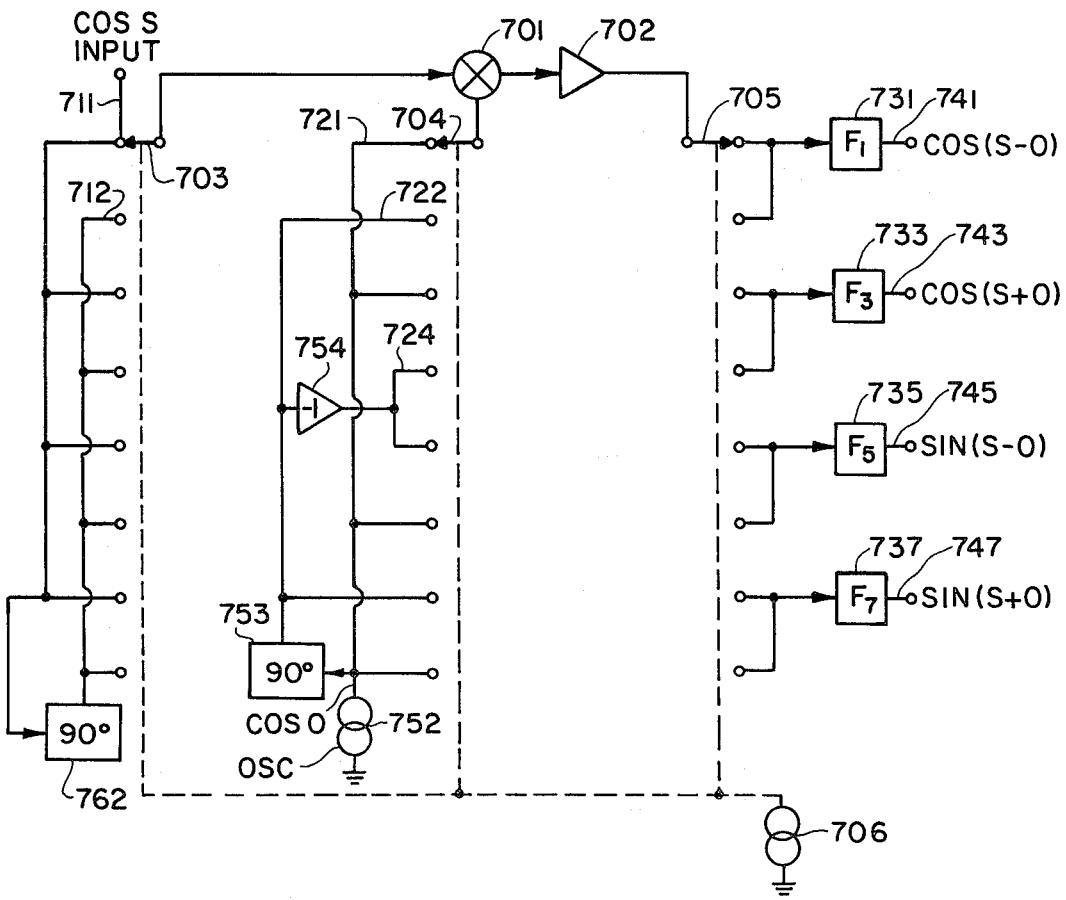
FIG. 7 illustrates a four quadrant time shared mixing system in accordance with the invention.

FIG. 7 illustrates, according to the invention a four quadrant demodulation system. A four quadrant demodulator will provide an in-phase and a quadrature phase pair of channels which have either the sum or the difference frequency signal suppressed, or may be used to obtain both such signals in quadrature separately. It is well known in the electrical arts, that mixing or multiplying two signals together will produce the sum and difference signals. Either the sum of the difference alone may be produced by phase shifting both applied signals by 90° and applying same to a second mixer. Addition or subtraction will cancel either the sum or difference signal depending on polarity of applied signals at each phase shift network. In the invention, all four possible signals may be produced or any combination less than four of the sum, difference, and quadrature signals of the sum and/or difference.

In FIG. 7, a preferred embodiment is shown which produces all four signals, namely, the sum of the applied signal frequencies, the difference of the applied signal frequencies and the quadrature of the sum of the applied signal frequencies, and the quadrature of the difference of the applied signal frequencies. A signal to be demodulated 711 is denoted by Cos S, and is connected to positions 1,3,5 and 7 of an eight position three pole switch, 703, 704 and 705. This signal 711 is phase shifted 90° by network 762 and applied to positions 2,4,6 and 8 of the same section of said switch as the signal 711. Thus in alternate positions, the cos and sine are applied by the switch to the mixer 701, thereby applying the input signal to the mixer. Another section of the three pole switch is used to apply an oscillator signal to the mixer. An oscillator, 752, which may be a VCO, has its signal applied to positions 1,3,6 and 8 of the oscillator section of said three pole switch. A phase shift network 753 is used to apply a 90° phase shifted signal to positions 2, and 7 of said section; and, an inverter 754 is used to apply a −90° phase shifted signal to positions 4 and 5 of said oscillator section. The mixer signal drives an amplifier of bandwidth in accordance with the invention 702 whose output is connected to a third section of said switch 705. Positions 1 and 2 are parallelled and used to drive a filter $F_1$ 731, which smooths and filters an output 741, which is the cos (S−O), the difference signal. Positions 3 and 4 are parallelled and filtered at 733 to produce an output 743 which is the cos (S+O), the sum signal. Positions 5 and 6 are parallelled and filtered at 735 to produce an output 745, which is the sin (S−O), the quadrature of the difference signal. Positions 7 and 8 are parallelled and filtered at 737 to produce an output 747, which is the sin (S+O), the quadrature of the sum signal. The operation of the system in FIG. 7 is clearly understood from the trigonometric relations (function product relations). Since the common elements 701 and 702 will have the same gain to each time shared signal therethrough, addition and subtraction at the filters, $F_1$, $F_2$, $F_3$ and $F_4$ will be excellent, providing isolation of the sum or frequency signals as the case may be in each position. The switch is driven by a common oscillator 706 at a high rate of speed so that a minimal time exists between each interval according to the theory of the invention, also described hereinabove.

It is clear, that the particular selection of timing order in the multiple pole switch herein is not important to the operation of the invention. What is required, is that at any interval, each included switch section be connected to the appropriate circuital points as required for any included interval, the order of the intervals being not essential to good operation. However, it is seen that selection of interval ordering may enhance summation by having signals to be summed close together to reduce time between intervals of data application to a summing filter. This reduces transients between adjacent intervals, but hinders good high frequency response, since the time between sampled events will be lengthened. The choice is of course left to the designer in accordance with the invention herein.

In a system where mixing takes place over a number of channels of similar type and nature, the invention is readily seen for its simplification and economies afforded. In a system where both mixing functions and multiplication functions occur, at greatly different frequencies, the use of a single mixing device for all such functions may or may not be economical, since the single mixing device will have to perform in each function at full required specification for each use, and the available device for such a wide spread of characteristics may increase the cost of one device to more than that of several devices of lesser quality, or spread in specifications. For example, The Costas loop demodulator may be changed from that shown in FIG. 3 to include a three position commutation system, where the third position is used to commutate mixer 301, into the position occupied in the illustrated embodiment by 361. Or, further for example, in the embodiment of FIG. 4, multiplier 409 may be removed and its function accomplished by additional commutation times allocated to time share mixer 401.

The invention permits very complex systems to be erected with very few components. For example by sufficient switching positions in the included commutation apparatus, the embodiments of FIGS. 2, 4 and 5 may all be accomplished together and with a single mixer if so desired.

Switching requirements may be met with in general simple semiconductor switches, all controlled together by a master overlying digital timing system. Ample timing means are well known in the art. The term mixer herein also includes an amplifier where its use is implied.

In the drawings, a multiple pole switch is shown, in order to more clearly teach the invention. It has been found, that a wide number of switching apparatus will faithfully perform in the invention. Multiplexers perform well, mixers perform well, by applying a switching signal to one port to turn the mixer hard on or off as the condition may require. In some applications, simple diodes have been used with excellent results in a network to provide all switching functions. A series of timing pulses is used to operate the diode network and turn on and off each included signal path to be switched. All of which may be understood as well known in the arts for multiplexing and switching. Where signal data frequencies are low, a ganged rotary switch has been found useful. The mechanical stops are removed from the switch assembly, such that no detents occur, and a motor is used to rotate the multiple ganged switch assembly. The motor speed is selected in accordance with the sampling rate determined in accordance with the invention as taught herein.

It is seen that numerous changes and variations may be effectuated in the particular embodiments shown herein to teach and describe the invention with clarity. It is therefore to be known that the particular embodiments shown and described are not intended to be limiting on the broad invention and its scope and application. The particular structures shown and described are not limiting on the spirit and scope of the broad invention.

What is claimed is:

1. A frequency conversion system, comprising:
   at least one source of data signals;
   a plurality of sources of injection oscillation signals differing from each other with respect to one of the parameters of frequency and phase;
   a plurality of output signal utilization means; and
   frequency converter means supplied with said data signals and with said different injection oscillation signals for supplying said output signal utilization means with respectively different output signals corresponding to respectively different combinations of said data signals with said injection oscillation signals;
   wherein said frequency converter means comprises a non-linear signal combiner having at least one data signal input terminal, a plurality of injection-oscillation signal input terminals and an output terminal; and
   time-multiplexing means for establishing successive different combinations of connections of said terminals of said signal combiner to said at least one source of data signals, to said plurality of injection-oscillation signal terminals and to said plurality of output signal utilization means to produce said respectively different output signals in sampled form;
   said time-multiplexing means switching among said different combinations at a rate at least as great as twice the highest frequency present in said data signals, and said plurality of output signal utilization means each comprising filter means for smoothing said output signals of sampled form to produce corresponding respective continuous output signals;
   wherein said at least one source of data signals comprises a first source to first data signals, said plurality of sources of first oscillator injection signals comprises a first source of first oscillator injection signals and a second source of second oscillator injection signals, said plurality of output signal utilization means comprises first and second output signal utilization means having first and second filter means respectively, said first and second oscillator injection signals differ from each other in phase but are the same in frequency, and said different combination comprise a first combination of said first data signals with said first oscillator injection signals and a second combination of said first data signals with said second oscillator injection signals.

2. The system of claim 1, comprising a voltage-controlled oscillator, means supplying the output of the filter means of said first output signal utilization means to the voltage-controlled oscillator to control the frequency of the output signals thereof, and quadrature phase-shifting means supplied with said output signals of said voltage-controlled oscillator for producing quadrature signals having a phase 90° different from that of said output of said voltage-controlled oscillator, and wherein said first oscillator injection signals are said output signals of said voltage-controlled oscillator and said second oscillator injection signals are said quadrature signals, thereby to form a phase-locked loop synchronous amplitude detection system, the amplitude-demodulated signal comprising the output signal of said filter means of said second output signal utilization device.

3. The system of claim 1, comprising a differentiation circuit supplied with said output signals from said signal combiner, a frequency multiplier circuit supplied at one of its signal input terminals with output signals of said differentiation circuit, and wherein said time-multiplexing means comprises means supplying said continuous output signals of said first and second filter means alternately to another signal input terminal of said frequency multiplier at said rate but in opposite time phase to the times at which said first and second filter means are connected to said signal combiner, said system also comprising means for filtering the output of said frequency multiplier to provide an output proportional to the difference in frequency of said first data signals and the frequency of said oscillator injection signals.

4. A single sideband conversion system, comprising:
   a source of single sideband signals;
   first, second, third and fourth system input terminals, and means supplying said single sideband signals to said first and second system input terminals in parallel;
   a signal multiplier;
   first and second oscillators of different frequencies;
   first, second, third and fourth oscillator input terminals;
   means applying oscillations from said first oscillator to said first and second oscillator input terminals respectively in quadrature phase relation to each other;

means applying oscillations from said second oscillator to said third and fourth oscillator terminals respectively in quadrature phase relation to each other;

first and second matched sideband filters having first and second filter input terminals, respectively;

a third output filter having third and fourth filter input terminals connected directly to each other;

means supplying the outputs of said first and second filters to said third and fourth system input terminals respectively;

time multiplex switching means for connecting said system input terminals sequentially and repetitively to one signal input terminal of said signal multiplier at a predetermined sampling rate, for connecting said oscillator input terminals sequentially and repetitively to another signal input terminal of said signal multiplier at said rate, and for connecting said filter input terminals sequentially and repetitively to the signal output terminal of said signal multiplier at said rate, said rate at which same switching means operates being at least twice the highest data frequency of said single sideband signals;

said switching means serving to connect said first system input terminal, said first oscillator input terminal and said first filter input terminal simultaneously to said frequency multiplier during each of a first set of intervals periodically recurrent at said rate; to connect said second system input terminal, said second oscillator input terminal and said second filter input terminal simultaneously to said frequency multiplier during each of a second set of intervals periodically recurrent at said rate and following said first set of intervals; to connect said third system input terminal, said third oscillator input terminal and said third filter input terminal simultaneously to said frequency multiplier during each of a set of intervals periodically recurrent at said rate and following said second set of intervals; and to connect said fourth system input terminal, said fourth oscillator input terminal and said fourth filter input terminal simultaneously to said frequency multiplier during each of a set of intervals periodically recurrent at said rate and following said third set of intervals.

5. A four-quadrant signal multiplexing system, comprising:

a first source of first input signals;

first switching means comprising eight contacts designated 1, 2, 3, 4, 5, 6, 7 and 8, respectively;

means for supplying said first input signals to a first set 1, 3, 5 and 7 of said contacts in a reference phase;

means for supplying said first input signals to a second set 2, 4, 6 and 8 of said contacts in phase quadrature with those applied to said first set;

a signal multiplier having first and second signal input terminals and an output terminal;

said first switch means comprising time-multiplexing means for sampling the signals at said eight contacts of said first switching means and for applying the resultant signal samples to one of said multiplier input terminals;

said second switching means comprising eight contacts designated 1, 2, 3, 4, 5, 6, 7 and 8, respectively;

a second source of second input signals;

means for supplying said second input signals to a first set 1, 3, 6 and 8 of said contacts of said second switching means in a reference phase;

means for supplying said second input signals to a second set 2 and 7 of said contacts of said second switching means in phase quadrature to said signals applied to said first set of contacts of said second switching means;

means for applying said second input signals to a third set 4 and 5 of said contacts of said second switching means in phase opposition to said signals applied to said second set of contacts of said second switching means;

said second switching means comprising time-multiplexing means for sampling the signals of said eight contacts of said second switching means and for applying the resultant samples to the other of said multiplier input terminals;

third switching means comprising eight contacts designated 1, 2, 3, 4, 5, 6, 7 and 8, respectively, and multiplexing means for applying output signals from said multiplier output terminal sequentially to said last-named eight contacts sequentially;

first output filter means supplied with signals at said contacts 1 and 2 of said third switching means;

second output filter means supplied with signals at said contacts 3 and 4 of said third switching means;

third output filter means supplied with signals at said contacts 4 and 5 of said third switching means;

fourth output filter means supplied with the signals at said contacts 7 and 8 of said third switching means; and means controlling said first, said second and said third switching means to operate them at a common switching rate at least as high as twice the highest frequency in said first and second input signals, and in phased relation such that the correspondingly numbered contacts of said first and second switching means are sampled simultaneously and the correspondingly numbered contact of said third switching means is simultaneously supplied with the output signals from said multiplier.

* * * * *